(12) United States Patent
Tsai et al.

(10) Patent No.: US 8,107,249 B2
(45) Date of Patent: Jan. 31, 2012

(54) DISPLAY PANEL APPARATUS

(75) Inventors: Cheng Min Tsai, Hsin-Chu (TW);
Ching Hung Cheng, Hsin-Chu (TW);
Han Chang Cheng, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 430 days.

(21) Appl. No.: 12/485,305

(22) Filed: Jun. 16, 2009

(65) Prior Publication Data

US 2010/0165586 A1 Jul. 1, 2010

(30) Foreign Application Priority Data

Dec. 30, 2008 (TW) ................................ 97151344 A

(51) Int. Cl.
*H05K 1/00* (2006.01)
(52) U.S. Cl. .................... 361/749; 361/807; 361/810
(58) Field of Classification Search ............. 361/679.01, 361/728, 729, 736, 737, 748, 749, 752, 807, 361/810; 108/59, 92, 96; 349/56, 58, 60, 349/84, 149, 150
See application file for complete search history.

(56) References Cited

U.S. PATENT DOCUMENTS

| 5,517,208 | A  | * | 5/1996  | Mori et al. ...................... 345/87 |
| 6,067,133 | A  | * | 5/2000  | Niibori et al. ................... 349/60 |
| 6,697,259 | B1 | * | 2/2004  | Nakamura ..................... 361/752 |
| 6,847,417 | B2 | * | 1/2005  | Kim ................................. 349/58 |
| 7,414,680 | B2 | * | 8/2008  | Lee et al. ........................ 349/58 |
| 7,436,668 | B2 | * | 10/2008 | Bae ............................... 361/704 |
| 7,719,627 | B2 | * | 5/2010  | Okuda ............................ 349/58 |
| 2005/0286228 | A1 | * | 12/2005 | Kim .............................. 361/704 |

FOREIGN PATENT DOCUMENTS

TW 491489 6/2002
* cited by examiner

*Primary Examiner* — Hung S Bui
(74) *Attorney, Agent, or Firm* — WPAT, P.C.; Anthony King

(57) ABSTRACT

A display panel apparatus includes a panel, a fixed frame, a circuit board and one or more flexible printed circuits (FPC). The fixed frame may be a back bezel or a frame, and is placed at the rear of the panel. The fixed frame includes two fixed portions extending outwards from a side thereof. The circuit board is connected to the two fixed portions and disposed at the side of the fixed frame, and extends away from the fixed frame. The maximum plane of the circuit board and the maximum plane of the fixed frame are disposed at a same (common) plane. More specifically, the maximum plane of the circuit board and the maximum plane of the fixed frame are not overlapping in a vertical direction, and are on a same horizontal plane.

25 Claims, 7 Drawing Sheets

DISPLAY PANEL APPARATUS

BACKGROUND OF THE INVENTION (A) Field of the Invention

The present invention relates to a display panel apparatus, and more specifically, to a display panel apparatus having an improved circuit board connection structure.

(B) Description of Related Art

Liquid crystal displays (LCD) have many advantages such as thin profile, light weight, low power consumption and low radiation, and therefore are widely used in current display applications. An LCD display primarily includes an LCD panel and a back light unit. The back light unit serves as an illumination source to the LCD panel, and the rotations of the liquid crystals are controlled by electrical signals so as to display images.

An LCD panel includes a display panel and a circuit board placed at a side of the display panel, and a flexible printed circuit (FPC) connects the display panel and the circuit board as a signal transmission interface. Generally, the circuit board and the display panel are not on the same plane. Rather, they are arranged perpendicular to each other. Therefore, the FPC is curved when the FPC connects the display panel and the circuit board.

For an LCD module with a back bezel, a printed circuit board is placed below the module and is secured by screws. This type of LCD module frequently suffers external impact during assembly and transportation, and if the FPC is not secured by screws it cannot withstand the external force. As a result, the FPC on the liquid crystal glass may be peeled from the printed circuit board during handling. Such PFC peeling causes an abnormal image display.

In summary, the panel may be deformed during assembly or mechanism testing. The bending of the panel pulls the FPC, and thus stress concentration occurs on the FPC and on the soldering connection between the FPC and the circuit board. When the stress exceeds a threshold, the FPC will be peeled or broken, resulting in degraded signal transmission.

SUMMARY OF THE INVENTION

In order to resolve the above problems, the present invention provides a display panel apparatus with improved connection structure of the circuit board to effectively decrease stress concentration caused by the flexible printed circuit itself or the soldering area connecting to the circuit board, thereby preventing the flexible printed circuit from being peeled or broken and improving the quality and durability of the display panel.

In accordance with a first embodiment of the present invention, a display panel apparatus includes a display panel, a fixed frame, a circuit board and at least one flexible printed circuit. The fixed frame may be a bezel or a sealant disposed at the rear of the display panel, and includes two fixed portions extending outward from a side of the fixed frame. The circuit board is connected to the two fixed portions, disposed at the side of the fixed frame and extending away from the fixed frame. A maximum plane of the circuit board and a maximum plane of the fixed frame are disposed on a same plane. In other words, the maximum plane of the circuit board and the maximum plane of the fixed frame are not overlapping in the vertical direction and, for example, are on a same horizontal plane.

The flexible printed circuit connects the display panel and the circuit board as a signal transmission interface therebetween, and is disposed between the two fixed portions, i.e., the two fixed portions are disposed outside of the two ends of the flexible printed circuit. More specifically, the flexible printed circuit connects the display panel and the circuit board, and the area at which the flexible printed circuit connects to the circuit board forms a soldering area that is between the two fixed portions. That is, the two fixed portions are disposed outside of the two ends of the soldering area.

In accordance with a second embodiment of the present invention, a display panel apparatus includes a display panel, a fixed frame, a circuit board and a flexible printed circuit. The fixed frame may be a bezel or a sealant disposed at the rear of the display panel, and includes two fixed portions extending outward from a side of the fixed frame. The circuit board is connected to the two fixed portions, disposed at the side of the fixed frame and extending away from the fixed frame. A maximum plane of the circuit board and a maximum plane of the fixed frame are disposed on a same plane. In other words, the maximum plane of the circuit board and the maximum plane of the fixed frame are not overlapping in vertical direction and, for example, are on a same horizontal plane.

The flexible printed circuit connects the display panel and the circuit board, and the flexible printed circuit's connection to the circuit board forms a soldering area that is on the fixed portions. In an embodiment, the fixed portion is connected to the circuit board by a tape, and the fixed portion is associated with the circuit board to form a space for accommodating the devices on the circuit board.

DETAILED DESCRIPTION OF THE INVENTION

The making and use of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
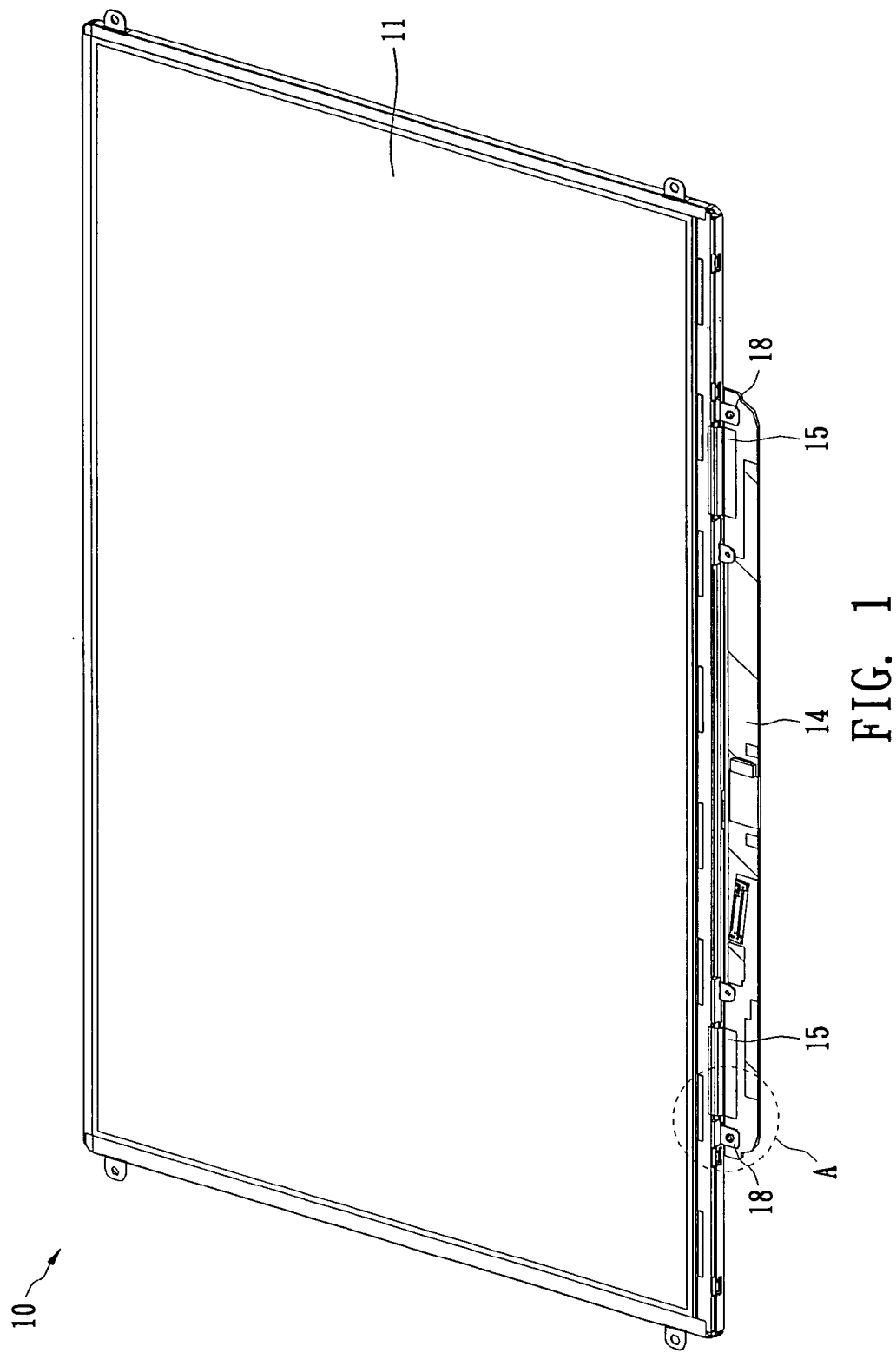
FIG. 1 is a three-dimensional view of a display panel apparatus in accordance with an embodiment of the present invention.
Figure 2:
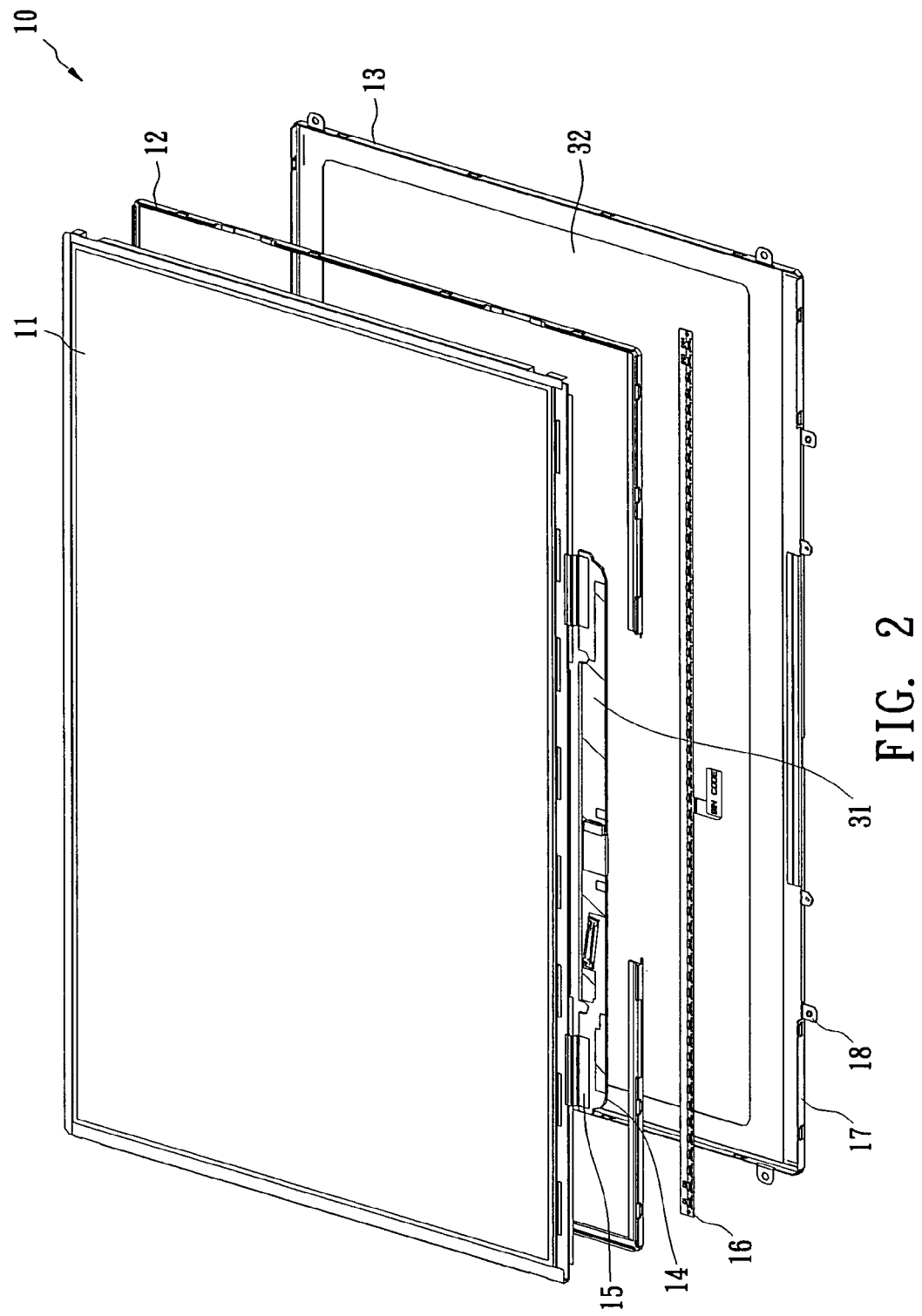
FIG. 2 is an exploded view of the display panel apparatus of FIG. 1.
Figure 3:
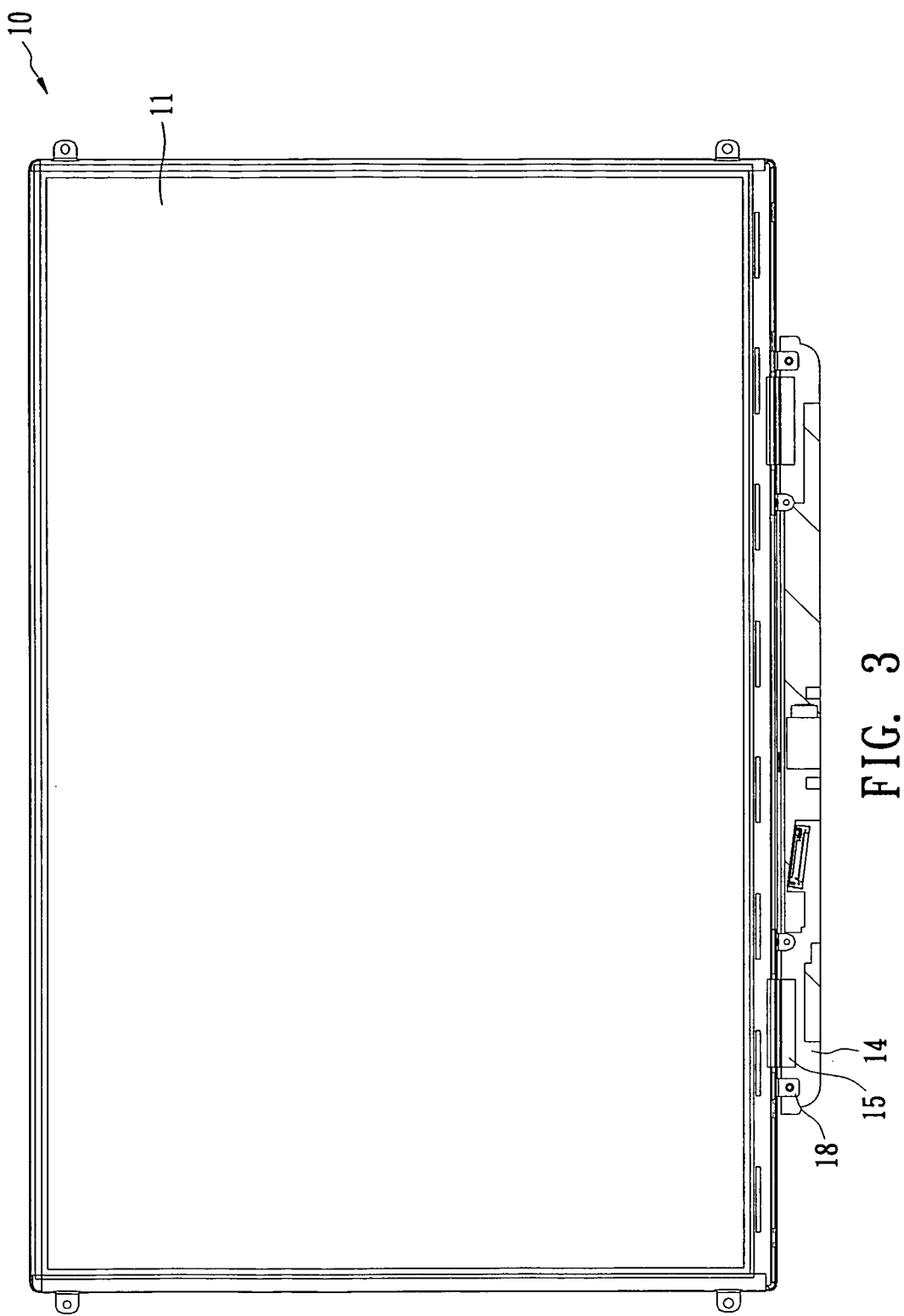
FIG. 3 is the top view of the display panel apparatus of FIG. 1.
Figure 4:
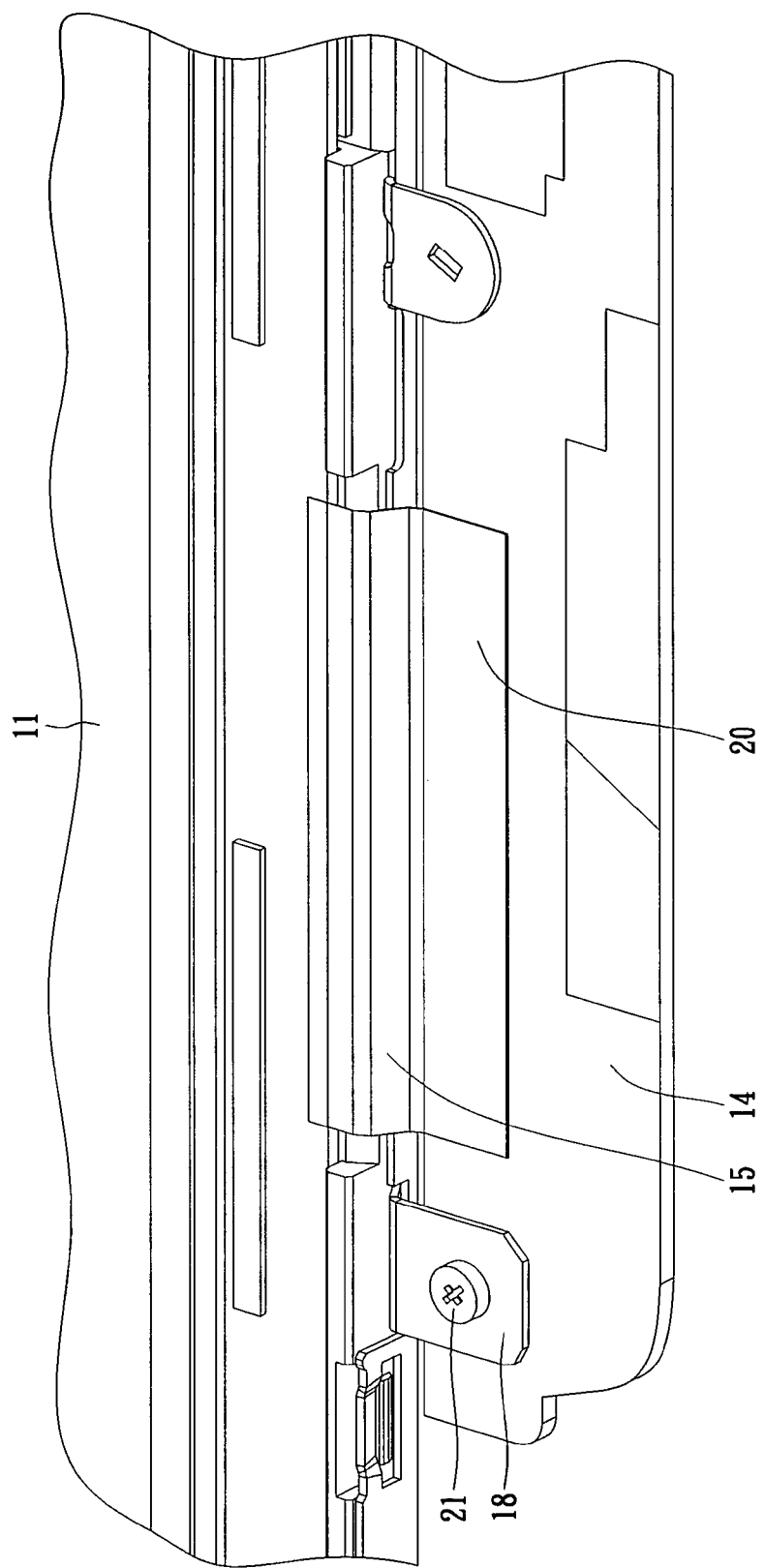
FIG. 4 is the magnification view of the area "A" of FIG. 1.

FIG. 1 shows a display panel apparatus 10 in accordance with an embodiment of the present invention. FIG. 2 shows an exploded view of the display panel apparatus 10. FIG. 3 shows the top view of the display panel apparatus 10. FIG. 4 shows the magnification view of the area "A" of FIG. 1. The display panel apparatus 10 includes a display panel 11, a sealant 12, a back bezel 13, a circuit board 14 and FPCs 15. The sealant 12 and the bezel 13 are disposed at the rear of the display panel 11 in sequence, and the bezel 13 includes two fixed portions 18, e.g., tabs, extending from a side 17 of the bezel 13. In an embodiment, the fixed portions 18 and the bezel 13 are formed integrally; however this invention is not restricted to this embodiment. The number of fixed portions 18 can be three or four instead of two as desired. Two sides of the circuit board 14 are connected to the two fixed portions 18. The circuit board 14 is disposed at the side 17 of the bezel 13 and extends in the direction away from the bezel 13, i.e., protruding outwards. The side 17 further has a light bar 16 as an illumination source of a backlight unit. The FPCs 15 connect the display panel 11 and the circuit board 14 as signal transmission interface therebetween, and are disposed between the two fixed portions 18.

The circuit board 14 and the bezel 13 are substantially on a same plane. Further, the plane 31 with maximum area of the circuit board 14 and the plane 32 with maximum area of the bezel 13 are not overlapped in vertical direction, and are substantially on a same plane. In other words, the circuit board 14 is not inclined toward the bezel 13, and the significantly decreased thickness of the display panel apparatus 10 is particularly suitable for thin panel display applications.

FIG. 4 illustrates the magnification view of the connection portion of the display panel 11 and the circuit board 14 (area "A" in FIG. 1). The place at which the FPC 15 connects to the circuit board 14 forms a soldering area 20. The circuit board 14 is connected to the fixed portion 18 by a fixed member 21, such as a screw, and the fixed portion 18 is placed outside of the soldering area 20 (The left side in this figure). Further referring to FIG. 1, two ends of the circuit board 14 are provided with FPCs 15 (or soldering areas 20), and the two fixed portions 18 are placed outside of the FPCs 15 (or soldering areas 20). In other words, one or more FPCs 15 or soldering areas 20 are placed between the two fixed portions 18.

In practice, the fixed portions 18 may be placed on a sealant 12 also and outwardly extend from the sealant 12, i.e., the fixed portions 18 of the panel display apparatus 10 may extend from the fixed frame such as a bezel 13 or a sealant 12, so as to prevent the FPCs 15 from being peeled or damaged due to stress concentration.

Figure 5:
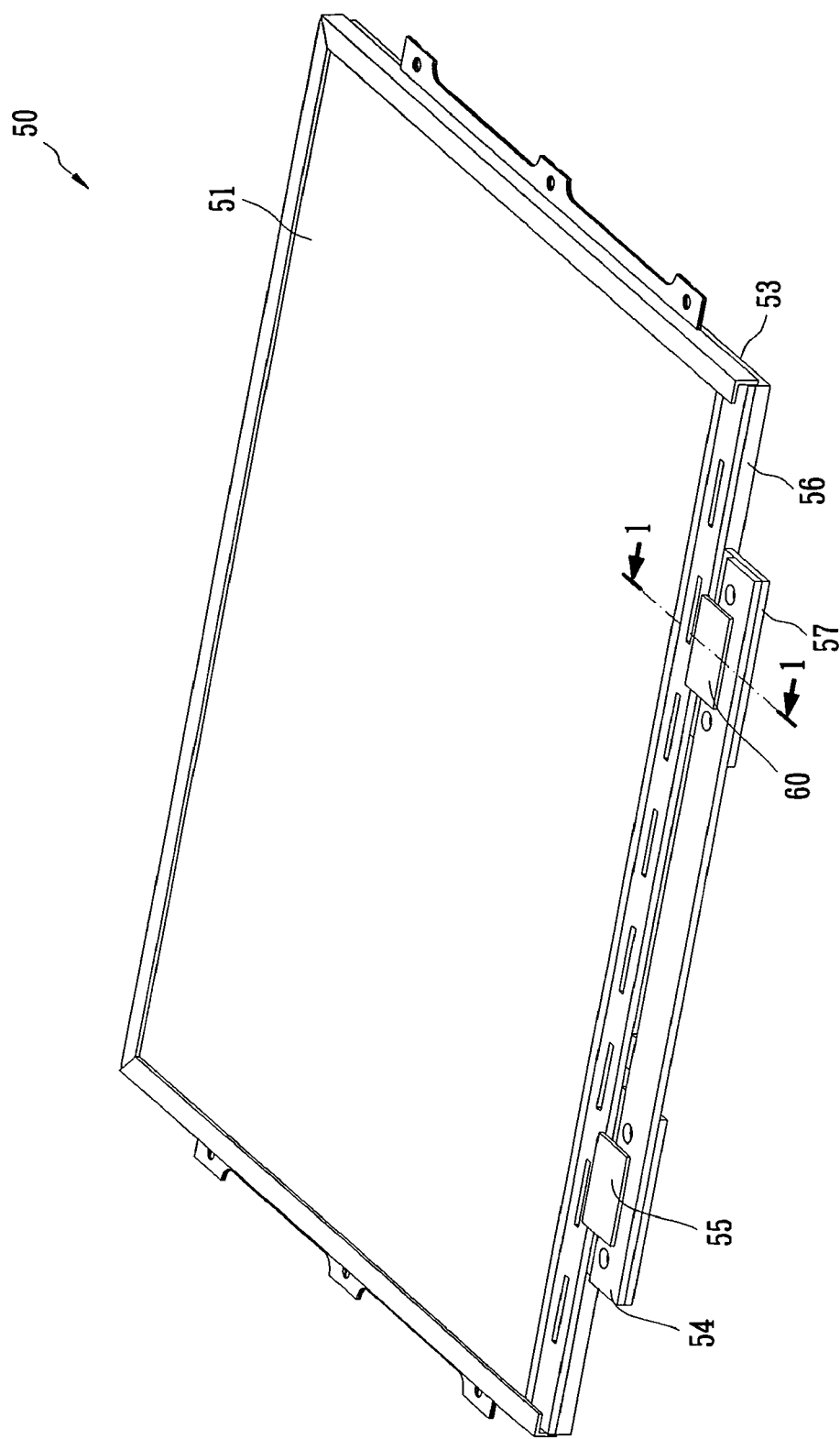
FIG. 5 is a three-dimensional view of a display panel apparatus in accordance with another embodiment of the present invention.
Figure 6:
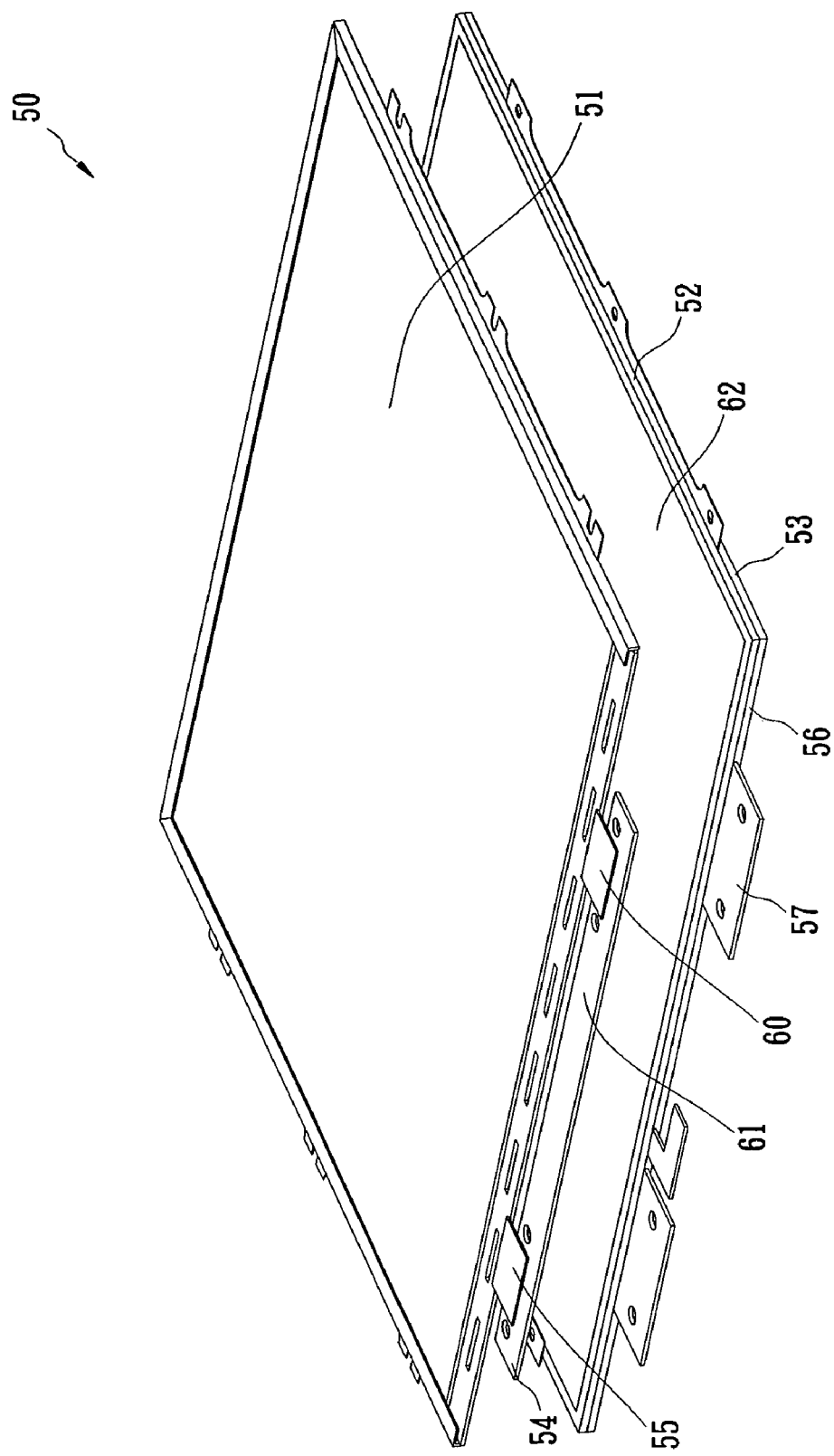
FIG. 6 is an exploded view of the display panel apparatus of FIG. 5.
Figure 7:
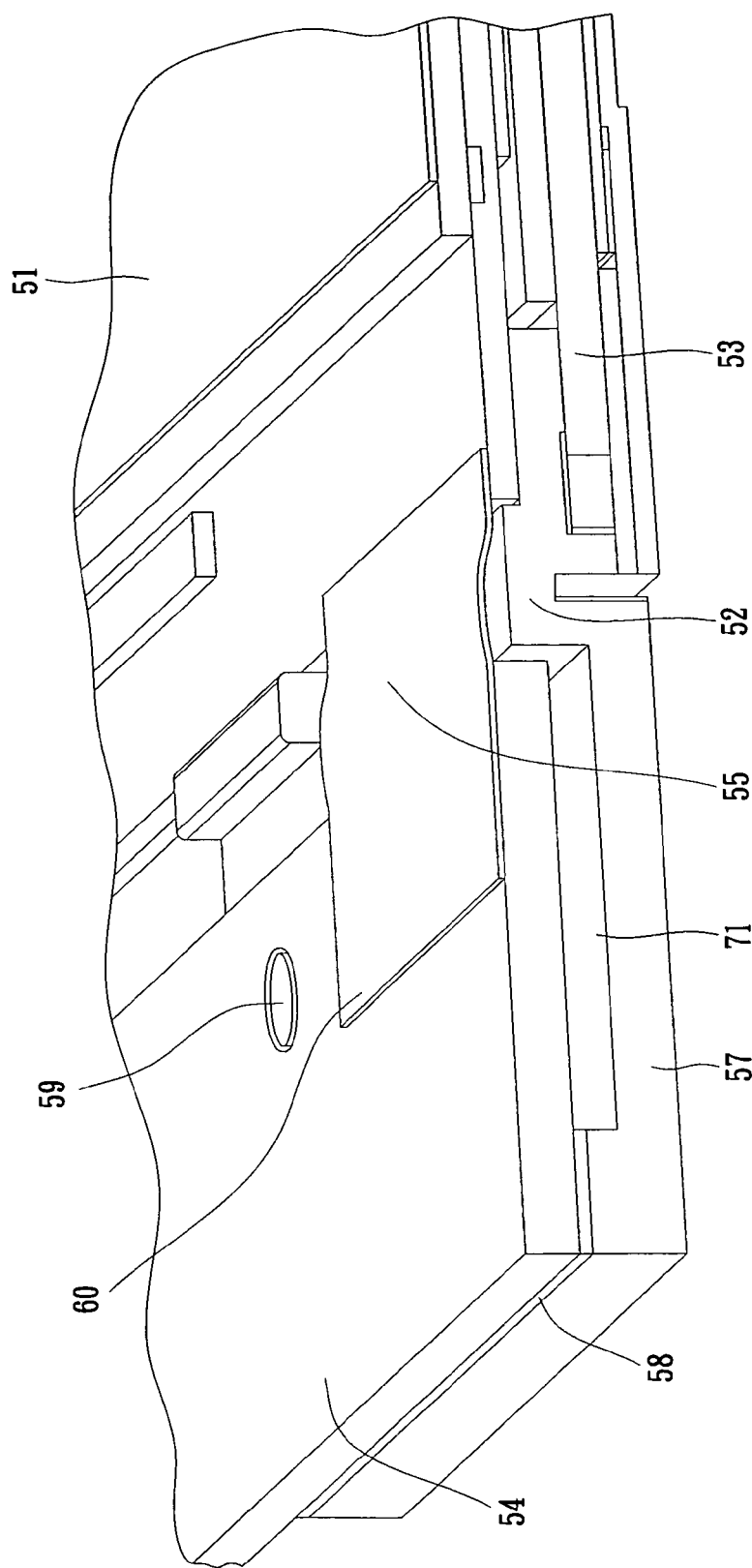
FIG. 7 is a cross-sectional view along line 1-1 of FIG. 5.

FIG. 5 illustrates a panel display apparatus 50 in accordance with another embodiment of the present invention, and FIG. 6 is the exploded view of the panel display apparatus 50. FIG. 7 is the cross-sectional view along line 1-1 of FIG. 5. The display panel apparatus 50 includes a display panel 51, a sealant 52, a back bezel 53, a circuit board 54 and FPCs 55. The sealant 52 is disposed at the rear of the display panel 51 and includes two fixed portions 57 extending outwards from a side 56 of the sealant 52. In this embodiment, the fixed portions 57 are shaped as plates. The circuit board 54 is connected to the two fixed portions 57, disposed at the side 56 of the sealant 52, and extending away from the sealant 52.

The fixed portions 57 support and are connected to the two ends of the circuit board 54, and the maximum plane 61 of the circuit board 54 and the maximum plane 62 of the sealant 52 are substantially on a same plane. Moreover, the plane 61 of maximum area in the circuit board 54 and the plane 62 of the maximum area of the sealant 52 are not overlapping in the vertical direction, and are substantially on a same horizontal plane. The circuit board 54 is not inclined toward the sealant 52. The FPCs 55 connect the display panel 51 and the circuit board 54, and the areas at which the FPCs 55 connect to the circuit board 54 form soldering areas 60. The soldering areas 60 are formed on the fixed portions 57. In this embodiment, the soldering area 60 is smaller than the fixed portion 57.

FIG. 7 illustrates the cross-sectional view along line 1-1 of FIG. 5. The fixed portion 57 extends from the sealant 52 and forms a recess which is associated with the circuit board 54 to form a room 71 for accommodating the devices on the circuit board 54. The fixed portion 57 is provided with a pin 59 for positioning. In this embodiment, two positioning pins 59 are placed at the two sides of the FPC 55 on the fixed portion 57 for positioning the circuit board 54 and the display panel 51. In an embodiment, the fixed portion 57 and the circuit board 54 are connected by a tape 58.

In practice, the fixed portions 57 may be disposed at the bezel 53 as well, and extend from a side of the bezel 53. In other words, the fixed portions 57 of the display panel apparatus 50 extend from the fixed frame, such as the bezel 53 or sealant 52, so as to prevent the FPCs 55 from being peeled or damaged due to stress concentration.

The display panel apparatuses 10 and 50 have improved capability to withstand bending and torsion, so that the stress-concentration issue can be effectively resolved. In addition to the prevention of FPC peeling, the display panel apparatus 50 does not use screws. In other words, screws are not needed for securing the circuit board and the liquid crystal glass (cell). Such design without screws eliminates the risk of screws being stripped, in the case that the frame made of aluminum is not sufficiently rigid, simplifies module assembly and saves manpower and materials.

The above-described embodiments of the present invention are intended to be illustrative only. Numerous alternative embodiments may be devised by those skilled in the art without departing from the scope of the following claims.

What is claimed is:

1. A display panel apparatus, comprising:
   a display panel;
   a fixed frame disposed at a rear of the display panel, and comprising two fixed portions extending outwards from a side of the fixed frame;
   a circuit board connected to the two fixed portions and disposed at the side of the fixed frame, and extending away from the fixed frame, wherein a maximum plane of the circuit board and a maximum plane of the fixed frame are on a same plane; and
   at least one flexible printed circuit connecting the display panel and the circuit board as a signal transmission interface between the display panel and the circuit board, and being disposed between the two fixed portions.

2. The display panel apparatus of claim 1, wherein the circuit board is not inclined with reference to the fixed frame.

3. The display panel apparatus of claim 1, wherein the circuit board is connected to the two fixed portions by fixed members.

4. The display panel apparatus of claim 1, wherein the two fixed portions are connected to two sides of the circuit board.

5. The display panel apparatus of claim 1, wherein an area at which the at least one flexible printed circuit connects to the circuit board forms a soldering area, and the soldering area is disposed between the two fixed portions.

6. The display panel apparatus of claim 1, wherein the fixed frame is a back bezel or a sealant.

7. A display panel apparatus associated with a display panel, comprising:
   a fixed frame disposed at a rear of the display panel, and comprising two fixed portions extending outwards from a side of the fixed frame;
   a circuit board connected to the two fixed portions and disposed at the side of the fixed frame, wherein a maximum plane of the circuit board and a maximum plane of the fixed frame are not overlapping in a vertical direction, and the maximum plane of the circuit board and the maximum plane of the fixed frame are disposed at a same horizontal plane; and
   at least one flexible printed circuit connecting the display panel and the circuit board, wherein an area at which the at least one flexible printed circuit connects to the circuit board forms at least one soldering area, and the at least one soldering area is disposed between the two fixed portions.

8. The display panel apparatus of claim 7, wherein the circuit board is not inclined with reference to the fixed frame.

9. The display panel apparatus of claim 7, wherein the circuit board is connected to the two fixed portions by fixed members.

10. The display panel apparatus of claim 7, wherein the two fixed portions are connected to two ends of the circuit board.

11. The display panel apparatus of claim 7, wherein the fixed frame is a back bezel or a sealant.

12. A display panel apparatus, comprising:
a display panel;
a fixed frame disposed at a rear of the display panel, and comprising two fixed portions extending outwards from a side of the fixed frame;
a circuit board connected to the two fixed portions, disposed at the side of the fixed frame and extending away from the fixed frame, wherein a maximum plane of the circuit board and a maximum plane of the fixed frame are on a same plane; and
at least one flexible printed circuit connecting the display panel and the circuit board, wherein a place the at least one flexible printed circuit connecting to the circuit board forms a soldering area;
wherein the two fixed portions are disposed outside of two ends of the soldering area.

13. The display panel apparatus of claim 12, wherein the circuit board is not inclined with reference to the fixed frame.

14. The display panel apparatus of claim 12, wherein the two fixed portions are connected to two ends of the circuit board.

15. The display panel apparatus of claim 12, wherein the maximum plane of the circuit board and the maximum plane of the fixed frame are on a same horizontal plane.

16. The display panel apparatus of claim 12, wherein the fixed frame is a back bezel or a sealant.

17. A display panel apparatus, comprising:
a display panel;
a fixed frame disposed at a rear of the display panel, and comprising two fixed portions outwardly extending from a side of the fixed frame;
a circuit board connected to the two fixed portions, disposed at the side of the fixed frame and extending away from the fixed frame, wherein a maximum plane of the circuit board and a maximum plane of the fixed frame are on a same plane; and
at least one flexible printed circuit connecting the display panel and the circuit board, wherein an area at which the at least one flexible printed circuit connects to the circuit board forms a soldering area, and the soldering area is on the fixed portion.

18. The display panel apparatus of claim 17, wherein the soldering area is smaller than the fixed portion.

19. The display panel apparatus of claim 17, wherein the fixed portion is connected to circuit board by a tape.

20. The display panel apparatus of claim 17, wherein the fixed portion is associated with the circuit board to form a space for accommodating devices on the circuit board.

21. The display panel apparatus of claim 17, wherein the flexible printed circuit on the fixed portion is provided with a positioning pin.

22. The display panel apparatus of claim 17, wherein the circuit board is not inclined with reference to the fixed frame.

23. The display panel apparatus of claim 17, wherein the two fixed portions are connected to two ends of the circuit board.

24. The display panel apparatus of claim 17, wherein the maximum plane of the circuit board and the maximum plane of the fixed frame are on a same horizontal plane.

25. The display panel apparatus of claim 17, wherein the fixed frame is a back bezel or a sealant.

* * * * *